United States Patent
Yen et al.

(10) Patent No.: US 6,399,235 B1
(45) Date of Patent: Jun. 4, 2002

(54) POLYMER ELECTROLYTE MEMBRANE ASSEMBLY FOR FUEL CELLS

(75) Inventors: Shiao-Ping S. Yen, Altadena; Andrew Kindler, San Marino; Andre Yavrouian, Glendale; Gerald Halpert, Pasadena, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/717,721

(22) Filed: Nov. 21, 2000

Related U.S. Application Data

(62) Division of application No. 09/158,643, filed on Sep. 22, 1998, now Pat. No. 6,150,047.
(60) Provisional application No. 60/059,493, filed on Sep. 22, 1997, and provisional application No. 60/066,849, filed on Nov. 25, 1997.

(51) Int. Cl.$^7$ ................................................. H07M 8/10
(52) U.S. Cl. ........................... 429/33; 429/30; 204/296; 521/27; 521/33; 521/37; 264/299
(58) Field of Search ..................... 429/33, 30; 204/296; 521/27, 33, 37; 264/299

(56) References Cited

U.S. PATENT DOCUMENTS

| | | | |
|---|---|---|---|
| 4,324,636 A | 4/1982 | Dankese ..................... 204/296 |
| 5,086,130 A | 2/1992 | Dickinson et al. ........... 525/537 |
| 5,246,582 A * | 9/1993 | Sluma et al. ................. 264/41 |
| 5,795,496 A | 8/1998 | Yen et al. ...................... 429/33 |
| 5,879,554 A * | 3/1999 | Loffelmann et al. .......... 264/41 |
| 5,882,810 A | 3/1999 | Mussell et al. ................ 429/33 |
| 5,906,716 A | 5/1999 | Mertesdorf et al. ........... 429/33 |
| 5,922,815 A * | 7/1999 | Aycock et al. ............... 525/391 |
| 6,056,903 A * | 5/2000 | Greeenwood ................. 264/41 |

* cited by examiner

Primary Examiner—Bruce F. Bell
(74) Attorney, Agent, or Firm—Fish & Richardson P.C.

(57) ABSTRACT

An electrolyte membrane for use in a fuel cell can contain sulfonated polyphenylether sulfones. The membrane can contain a first sulfonated polyphenylether sulfone and a second sulfonated polyphenylether sulfone, wherein the first sulfonated polyphenylether and the second sulfonated polyphenylether sulfone have equivalent weights greater than about 560, and the first sulfonated polyphenylether and the second sulfonated polyphenylether sulfone also have different equivalent weights. Also, a membrane for use in a fuel cell can contain a sulfonated polyphenylether sulfone and an unsulfonated polyphenylether sulfone. Methods for manufacturing a membrane electrode assemblies for use in fuel cells can include roughening a membrane surface. Electrodes and methods for fabricating such electrodes for use in a chemical fuel cell can include sintering an electrode. Such membranes and electrodes can be assembled into chemical fuel cells.

3 Claims, No Drawings

POLYMER ELECTROLYTE MEMBRANE ASSEMBLY FOR FUEL CELLS

CROSS REFERENCE TO RELATED APPLICATION

This application is a divisional and claims the benefit of priority under U.S.C. § 120 of U.S. application Ser. No. 09/158,643, filed Sep. 22, 1998, now U.S. Pat. No. 6,150,047.

This patent application also claims benefit of U.S. Provisional Application No. 60/059,493 filed Sep. 22, 1997, and U.S. Provisional Application No. 60/066,849 filed Nov. 25, 1997.

STATEMENT AS TO FEDERALLY SPONSORED RESEARCH

The invention described herein was made in the performance of work under a NASA contract, and is subject to the provisions of Public Law 96-517 (35 U.S.C. § 202) in which the contractor has elected to retain title.

FIELD OF THE INVENTION

The invention relates to chemical fuel cells. More particularly, the invention relates to membranes used in the membrane electrode assemblies of chemical fuel cells.

BACKGROUND OF THE INVENTION

Chemical fuel cells utilize renewable resources and provide an alternative to burning fossil fuels to generate power. Fuel cells utilize the oxidation/reduction potentials of chemical reactions to produce electrical current.

For example, methanol is a known example of a fuel source used in chemical fuel cells. In a methanol driven fuel cell, methanol and water can be circulated past an anode that is separated from a cathode by a membrane that is selectively permeable to protons. The following chemical reaction takes place at the anode.

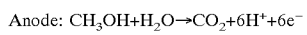

Anode: $CH_3OH+H_2O \rightarrow CO_2+6H^++6e^-$

The protons generated at the anode pass through the membrane to the cathode side of the fuel cell. The electrons generated at the anode travel to the cathode side of the fuel cell by passing through an external load that connects the anode and cathode. Air or an alternative oxygen source is present at the cathode where the electro-reduction of oxygen occurs resulting in the following chemical reaction.

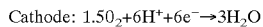

Cathode: $1.5O_2+6H^++6e^- \rightarrow 3H_2O$

One of the key aspects of a chemical fuel cell is the membrane-electrode assembly (MEA). The MEA typically includes a selectively permeable polymer electrolyte membrane bonded between two electrodes, e.g., an anode electrode and a cathode electrode. The materials chosen for constructing the membrane should allow protons to pass through the membrane and prevent the fuel sources from passing through the membrane.

When the fuel, e.g., methanol, permeates the membrane and combines with oxygen on the cathode side of the fuel cell, the overall operating potential of the fuel cells is diminished. This phenomenon is termed fuel crossover. The rate of crossover is a parasitic reaction that is proportional to the permeability of the fuel through the membrane and increases with increasing fuel concentration and temperature. Thus, choosing the appropriate membrane material can increase the overall fuel cell performance.

One currently preferred resin of choice for fabricating MEAs has been NAFION™, which is a co-polymer of a tetrafluoroethylene and perfluorpolyether sulfonic acid made by DuPont De Nemours. NAFION(™) membranes are chemically stable, strong and reasonably conductive. There are at least two drawbacks associated with NAFION™. NAFION™ is extremely expensive. Further, NAFION™ suffers from fuel crossover. Accordingly, there exists a need for improved and cost-effective fuel cell electrolyte membranes.

SUMMARY OF THE INVENTION

In one aspect, the present invention provides an electrolyte membrane for use in a fuel cell that contains sulfonated polyphenylether sulfones.

In one embodiment, the membrane contains a first sulfonated polyphenylether sulfone and a second sulfonated polyphenylether sulfone, wherein the first sulfonated polyphenylether and the second sulfonated polyphenylether sulfone have equivalent weights greater than about 560, and the first sulfonated polyphenylether and the second sulfonated polyphenylether sulfone also have different equivalent weights.

In another embodiment, the sulfonated polyphenylether sulfones of the membrane can have equivalent weights that differ by at least about 50 equivalent weight units. The first and second sulfonated polyphenylether sulfones can have equivalent weights ranging from about 560 to about 720. Further, one of the sulfonated polyphenylether sulfones can have an equivalent weight greater than about 1000. Accordingly, there can be a membrane wherein the first sulfonated polyphenylether sulfone has an equivalent weight greater than about 1000, and the second sulfonated polyphenylether sulfone has an equivalent weight ranging from about 560 to about 720.

In another embodiment, the relative amounts of the sulfonated polyphenylether sulfones can be altered so that the first sulfonated polyphenylether sulfone is at least about 70% of the membrane on a weight by weight basis. The first sulfonated polyphenylether sulfone can be at least about 70% of the membrane on a weight by weight basis when the second sulfonated polyphenylether sulfone is no greater than about 30% of the membrane on a weight by weight basis. As such, it is possible to have a membrane where the first sulfonated polyphenylether sulfone is about 70% of the membrane on a weight by weight basis, and the second sulfonated polyphenylether sulfone is about 30% of the membrane on a weight by weight basis.

In another embodiment, a membrane for use in a fuel cell can contain a sulfonated polyphenylether sulfone and an unsulfonated polyphenylether sulfone. The sulfonated polyphenylether sulfone can have an equivalent weight of at least about 560, ranging from about 560 to about 720. The sulfonated polyphenylether sulfone can encompass at least about 75% of the total weight of the membrane on a weight by weight basis. When the sulfonated polyphenylether sulfone is at least about 75% of the total weight of the membrane on a weight by weight basis, the unsulfonated polyphenylether sulfone can be no greater than about 25% of the total weight of the membrane on a weight by weight basis.

The unsulfonated polyphenylether sulfone can be the base polymer of the sulfonated polyphenylether sulfone. In such an instance, it is possible for the sulfonated polyphenylether sulfone to have an equivalent weight of at least about 560 or an equivalent weight ranging from about 560 to about 720.

The sulfonated polyphenylether sulfone can be at least about 75% of the total weight of the membrane on a weight by weight basis. When the sulfonated polyphenylether sulfone is at least about 75% of the total weight of the membrane on a weight by weight basis, it is possible for the unsulfonated polyphenylether sulfone to be no greater than about 25% of the total weight of the membrane on a weight by weight basis.

In a second aspect, the invention features a fuel cell that includes a fuel supply, an anode assembly, a cathode assembly, and a membrane containing a sulfonated polyphenylether sulfone and an unsulfonated polyphenylether sulfone, wherein the membrane can be bonded between the anode assembly and the cathode assembly.

In a third aspect, the invention features a fuel cell that includes a fuel supply, an anode assembly, a cathode assembly, and a membrane containing a first sulfonated polyphenylether sulfone and a second sulfonated polyphenylether sulfone, wherein the first sulfonated polyphenylether and the second sulfonated polyphenylether sulfone can have equivalent weights greater than about 560, and the first sulfonated polyphenylether and the second sulfonated polyphenylether sulfone can have different equivalent weights, and wherein the membrane can be bonded between the anode assembly and the cathode assembly.

In a fourth aspect, the invention features a method for manufacturing a membrane for use in a fuel cell that includes the steps of mixing at least one sulfonated polyphenylether sulfone polymer with an unsulfonated polyphenylether sulfone polymer to form a blend, casting the blend for a first time, dissolving the blend after the first casting in a solvent, and casting the blend for a second time, the blend forming a visually stable membrane. The solvent can include dimethylformamide.

In a fifth aspect, the invention features a method for manufacturing a membrane electrode assembly for use in a fuel cell that includes the steps of contacting a membrane containing a blend of a sulfonated polyphenylether sulfone polymer and an unsulfonated polyphenylether sulfone polymer with a catalyst thereby forming a membrane bonding side, coating an electrode support with an electrolyte polymer and a catalyst thereby forming an electrode bonding side, contacting the membrane bonding side and the electrode bonding side, and bonding the membrane bonding side and the electrode bonding side. The electrolyte polymer can include a liquid mixture of a co-polymer of a tetrafluoroethylene and a polyhydrocarbon sulfonic acid and a catalyst. The polyhydrocarbon sulfonic acid can be fluorinated and can include, for example, perfluoropolyether sulfonic acid.

The method may include roughening a membrane surface before contacting said membrane with said catalyst. The roughening can be performed by sanding the membrane.

In a sixth aspect, the invention features a method for fabricating an electrode for use in a chemical fuel cell that includes the steps of contacting an electrode support with a catalyst, and sintering the electrode that now contains a catalyst. The sintering of the electrode can be performed in a nitrogen environment.

In a seventh aspect, the invention features a method for fabricating an electrode for use in a chemical fuel cell that includes the steps of contacting an electrode support with a first catalyst, sintering the electrode support containing the first catalyst, and contacting the sintered electrode with a second catalyst. The second catalyst can further include an electrolyte polymer.

In an eighth aspect, the invention features an electrode for use in a fuel cell that includes a catalyst contacting a side of an electrode support, wherein the electrode can be sintered after contacting the catalyst. The electrode can further include another catalyst contacting the electrode after the electrode is sintered.

In a ninth aspect, the invention features a fuel cell that includes a fuel supply, a membrane, and an electrode that can include a sintered electrode support containing a catalyst on a side of the sintered electrode support, wherein the electrode can be sintered after contacting the catalyst. In another embodiment, the fuel cell can include further a catalyst contacting the sintered electrode.

The invention provides membranes and fuel cells that can be constructed from relatively inexpensive polyphenylether sulfones. Further, the membranes and electrodes can provide improved fuel cell performance by diminishing parasitic crossover reactions and sustaining voltage differentials across membrane electrode assemblies.

Other features and advantages of the invention will be apparent from the following description of the preferred embodiments and from the claims.

DESCRIPTION OF THE PREFERRED EMBODIMENTS

The invention features membranes and membrane electrode assemblies for use in chemical fuel cells that can be constructed from sulfonated polyphenylether sulfones (PES). The PES can contain one or more individual PES polymers and can be derived from any source. An illustrative example of useful PES polymers are the PES resins sold under the trademark ULTRASON™ by the BASF Corporation. A preferred PES is ULTRASON™ E6020.

PES can be sulfonated using any method. An illustrative method for sulfonating PES can include the following steps. A sample of dried PES such as ULTRASON™ E6020 can be weighed and dissolved in a solvent such as methylene chloride. This solution can be stirred at room temperature until a precipitation takes place resulting in a slurry. The slurry can then be chilled to about 0–5° C. with continuous stirring. A measured concentration of sulfur trioxide dissolved in a solvent such as methylene chloride can be added dropwise under dry nitrogen while stirring the slurry. An illustrative example of a sulfur trioxide is the stabilized sulfur trioxide sold under the trademark SULFAN™. The addition of sulfur trioxide can be added over about a 30 minute time frame. The resulting mixture can be stirred for an additional 2 hours. The coolant can be removed and a top solvent layer can be decanted. The now sulfonated PES can be dried under a vacuum, e.g., 1 mbar vacuum at 100° C. for 12 hours. For additional purification the sulfonated PES can be extracted using known methods, e.g., Soxhlet treatment.

The molar ratio of sulfur trioxide to the resulting PES sulfonation can be determined empirically. Accordingly, the degree of PES sulfonation can be controlled by adding various concentrations of sulfur trioxide. The sulfonated polymer properties can be determined using known methods. Useful methods for determining the degree of sulfonation include $^1$H-nuclear magnetic resonance and glass transition temperature analysis. The degree of PES sulfonation can be expressed by any acceptable manner. For example, PES sulfonation can be expressed as a mole percentage or an equivalent weight. A 100% mole percentage would correspond to 1 sulfur trioxide sulfonation per PES repeating group. A 100% mole percentage would translate into an equivalent weight of 295 (214 g/mole of PES+81 g/mole of —$SO_3H$). Accordingly, a 50% mole percentage would be equal to an equivalent weight of 509 (2*214 g/mole of PES+81 g/mole of —$SO_3H$).

The degree of sulfonation can affect the overall membrane characteristics including ion permeability, swelling, and bonding. Sulfonated PES becomes more jelly-like as the equivalent weight decreases. Conversely, sulfonated PES becomes more plastic-like as the equivalent weight increases. Sulfonated PES polymers described and claimed herein can have equivalent weights greater than about 560 equivalent weight units. Preferably, the sulfonated PES polymers have equivalent weights ranging from about 560 to about 720.

Sulfonated PES polymers having different equivalent weights can be combined to form a blend. For example, a sulfonated PES having an equivalent weight of 620 can be blended with a sulfonated PES having an equivalent weight of 670. It may be advantageous to blend polymers having highly divergent equivalent weights, e.g., combining a sulfonated PES polymer having equivalent weight of at least 1000 with a sulfonated PES having an equivalent weight from about 560 to about 720.

Alternatively, a sulfonated PES polymer can be blended with an unsulfonated PES polymer. The unsulfonated PES polymer can be the unsulfonated base-polymer of the sulfonated PES polymer. For example, a sample of ULTRASON™ E6020 can be sulfonated using the methods described above and then the sulfonated PES can be blended with an unsulfonated sample of its unsulfonated base-polymer, i.e., ULTRASON™ E6020. Accordingly, an unsulfonated base-polymer would be of the same chemical grade as the sulfonated PES.

It is to be understood that blended PES polymers may not form a true solution but may be separated into individual domains of the individual polymers. Atomic force microscopy may be able to detect polymer domains within membranes cast from blended polymers. Blended polymers can be formed in any ratio. For example, a blended polymer can be formed by combining a sulfonated PES polymer and an unsulfonated PES polymer at a ratio of about 75%:25% on a weight by weight basis. A blended polymer can be formed by combining a first and a second sulfonated PES polymer at a first PES to second PES ratio of about 75%:25% on a weight by weight basis. A PES blend can include other weight ratios (e.g., 50:50, 60:40, 70:30, etc.). Additionally, it may be advantageous to blend more than two polymers. Blended polymers can be crosslinked using known methods.

Blended PES polymers can be cast into an electrolyte membrane for use in a chemical fuel cell using known methods. Blends of PES polymers having lower sulfonation concentrations, i.e., higher equivalent weights, can at times undergo a visual phase separation when cast into membranes using known casting methods.

Blended PES polymers that undergo phase separation after a single cast may require a double-casting method. A double-casting method can include the following steps. A blended PES polymer can be dissolved in a casting solvent such as dimethylformamide (DMF) to form a dope. The blended PES polymer can include sulfonated and unsulfonated PES polymers. Alternatively, the blended PES polymer can include sulfonated PES polymers having different equivalent weights. The dope can be cast onto a glass plate to form a membrane using a conventional caster equipped with a doctor blade. The solvent can be allowed to evaporate in the presence of air. The cast membrane can be redissolved in a solvent such as DMF to form another dope. The dope can then be cast a second time and again allowed to dry or cure in the presence of air to form a membrane. The membrane formed after the second casting should remain visually stable, i.e., no phase separation apparent to the naked eye, when the solvent is allowed to evaporate. Parameters such as ambient humidity, temperature, speed of the casting blade and the ratio of polymer to solvent can affect the quality of the resulting membrane. The double-casting method has been found to work at ambient humidities from about 30% to about 50% at room temperature. The viscosity of the polymer blend and the extent of sulfonation can affect the viscosity of the polymer blend. Therefore, it may be necessary to adjust the doctor blade speed and/or the polymer blend to solvent ratio in order to obtain an acceptable viscosity for a dope. Acceptable viscosities can generally be determined on an empirical basis and are known to those of skill in the art to which this invention pertains.

After a membrane is cast, it can be cut to size and assembled into a MEA for use in a chemical fuel cell using known methods. Typically, the sized membrane is bonded to a catalyst containing cathode electrode on first side and an catalyst containing anode electrode on a second side, thus forming a MEA where the membrane is disposed between the cathode and the anode. A known technique for bonding the membrane to the electrodes involves hot-pressing the MEA. Examples of methods for forming membranes, cathode electrodes, anode electrodes, MEAs and fuel cells is disclosed in U.S. Pat. No. 5,773,162, which is hereby incorporated in its entirety.

Membranes fabricated using sulfonated PES polymers having equivalent weights greater than about 560 can be difficult to bond to the cathode and anode electrodes during MEA fabrication. A preferred method for bonding a blended PES membrane, especially PES blends that are difficult to bond to electrodes, to an electrode can include the following steps. A surface of a PES-based membrane can be sanded with a fine grit sandpaper such as a 600 grit sandpaper so as to roughen the membrane surface. A small amount, typically less than about 30 mg, of an appropriate catalyst can be applied to the sanded surface. Catalysts are known. For example, less than 30 mg of a catalyst can be rubbed onto the sanded membrane using a moistened cosmetic-type applicator and allowed to dry. A suitable liquid electrolyte polymer can be applied to the now catalyst-containing surface and allowed to dry. For example, NAFION™ 117 dissolved in an alcohol can be sprayed onto the membrane using an airbrush.

A preferred MEA further includes a sintered electrode containing a catalyst. A sintered electrode containing a catalyst may also include a second catalyst coating. A method for fabricating an electrode containing a sintered electrode can include the following steps. A carbon paper electrode support can be contacted with a catalyst ink so as to cover the carbon paper support with from about 1 mg/cm$^2$ of catalyst ink to about 4 mg/cm$^2$ of catalyst ink and allowed to dry. The catalyst ink can contain a mixture of a catalyst, a tetrafluoroethylene fluorocarbon polymer, water and a surfactant. Useful tetrafluoroethylene fluorocarbon polymers can include the polymers sold under the trademark TEFLON™ by DuPont De Nemours & Co, e.g., TEFLON™ 30. Useful surfactants can include the surfactants sold under the trademark TRITON™ by the Union Carbide Corporation. The catalyst-covered electrode paper can then be sintered at an elevated temperature., e.g., 350° C., in a nitrogen gas environment. The sintered electrode can then be coated with a liquid electrolyte polymer and bonded to an electrolyte membrane using the above-described methods.

Alternatively, a carbon paper electrode support can be coated with a first coat of a catalyst ink and sintered as described above. Thereafter, a second coat of catalyst ink can be applied to the now-sintered catalyst coat. The second catalyst ink can contain a dissolved electrolyte polymer, water and a catalyst. After the second catalyst coating, the electrode can be coated with a liquid electrolyte membrane and bonded to an electrolyte membrane using the above-described methods. Sintering and/or two-coating electrodes may improve fuel cell performance.

It is to be understood, however, that the blended PES polymers described herein can also be fabricated into MEAs using conventional techniques. For example, cathode and anode electrodes can be formed by coating a carbon paper backing with a catalyst ink and contacted with a liquid electrolyte polymer. The liquid electrolyte polymer can be sprayed on, for example, with an airbrush. Typically, the liquid electrolyte polymer is an electrolyte polymer, such as the NAFION™ type resins, dissolved in a suitable solvent. Any other electrolyte polymer dissolved in a suitable solvent that could function in a MEA may also suffice as a liquid electrolyte polymer. Such polymers would include the PES polymers described herein. To date, NAFION™-based polymers have been preferred because they are soluble in alcohol, a solvent known to be inert towards the catalysts typically used in a MEA.

Catalysts useful in any of the methods or assemblies described above include any catalysts used for manufacturing chemical fuel cells. For example, useful catalysts can include nickel (Ni), titanium (Ti), zirconium (Zr), tin (Sn), tin oxides such as $SnO_2$, ruthenium (Ru), platinum (Pt), osmium (Os), iridium (Ir), tungsten (W), tungsten oxides such as $WO_3$, rhenium (Re), alloys thereof, and other similar materials.

Once a MEA is fabricated, it can be assembled into a chemical fuel cell. Methods for constructing chemical fuel cells, including methanol fuel cells are known. All fuel cell components should be of fuel cell grade. A fuel cell can include a fuel supply, an anode assembly, a cathode assembly, and an electrolyte membrane cast from a sulfonated polyphenylether sulfone and an unsulfonated polyphenylether sulfone wherein the membrane is bonded between the anode and the cathode. A fuel cell can also include a fuel supply, an anode assembly, a cathode assembly, and a electrolyte membrane cast from a blend of a first sulfonated polyphenylether sulfone and a second sulfonated polyphenylether sulfone wherein the first sulfonated polyphenylether and the second sulfonated polyphenylether sulfone have equivalent weights greater than about 560, and wherein the membrane is bonded between the anode assembly and the cathode assembly. Further, the first and second sulfonated polyphenylethers can have different equivalent weights.

Fuel cell performance can be evaluated using known methods. For example, a methanol fuel cell having methanol and oxygen fuel sources can be attached to a power supply and an external electrical load. The power supply can be used to hold the current constant allowing measurement of the voltage drop across the fuel cell electrodes under steady state conditions.

Parasitic crossover rates may be measured using any method. For example, a methanol fuel cell can be equipped with a gas sampling device and a $CO_2$ analyzer. Using known techniques methanol consumption/$CO_2$ production can be determined quantitatively under a load and in an open circuit condition. Useful samplers and analyzers include the Horiba model ES 510 gas sampler and the Horiba VIA 510 gas analyzer manufactured by the Horiba Corporation, 17671 Armstrong Ave., Irvine, Calif., 92714. A $CO_2$ molar flow rate can be determined by monitoring the volume percentage of $CO_2$ produced and the gas flow rate. An electrical equivalent for methanol depletion due to crossover can be determined from the $CO_2$ production rate, which is proportional to methanol consumption. A current density can also be determined by dividing the current by the surface area of the MEA.

The membranes and methods disclosed herein can be applied to any type of polymer electrolyte fuel cell. For example, the methods disclosed herein can be used to prepare MEAs that can be used in methanol fuel cells and hydrogen fuel cells.

EXAMPLE 1

Measuring the Voltage and Current of a Fuel Cell

A sample of ULTRASON™ E6020 was sulfonated using sulfur trioxide by the methods disclosed herein. The resulting sulfonated PES had an equivalent weight (EW) of 620. A PES blend containing 75% on a weight by weight basis of the 620 EW sulfonated PES and 25% unsulfonated ULTRASON™ E6020. The blend was dissolved in DMF and cast into a membrane using known methods. Upon curing, the membrane appeared to undergo phase separation. The membrane was allowed to dry, redissolved in DMF and recast into a membrane. After hydration, the membrane was 4 mils thick.

After drying, the membrane was sanded with 620 grit sandpaper on the anode side and the cathode side of the membrane. Next the cathode side and the anode side were rubbed with the appropriate catalyst. A fuel cell grade platinum black catalyst sold by the Johnson Matthey Catalog Company, Inc., Wardhill, Mass., was used for the cathode. The anode catalyst contained a 50%:50% weight percentage Pt-Ru alloy catalyst using a moistened cosmetic type applicator. The membrane was then airbrush sprayed with a liquid NAFION™ 117 polymer.

The cathode was contacted with a cathode catalyst ink resulting in a cathode electrode containing 4 mg of catalyst per square centimeter of cathode backing. The cathode catalyst ink contained 180 mg of catalyst, 405 mg of a 6.67 weight percentage of TEFLON™ 30, and 720 mg of a 5% NAFION™ solution. The anode was contacted with an anode catalyst ink containing 180 mg of catalyst, 690 mg of a 7.64 weight percentage of TEFLON™ 30, and 900 mg of a 5% NAFION™ solution.

The membrane and electrodes were then assembled into a membrane electrode assembly using known methods. After hot-pressing the membrane was about 3.35 mils thick. The membrane electrode assembly was then assembled into a methanol fuel cell. The fuel cell was attached to an external load and a power supply. The fuel cell was operated at 91° C. under load with 1 molar methanol, 3.45 liters/minute air flow at 20 psig. The power supply was used to generate a constant current of 300 ma/$cm^2$, which produced 212 mv.

EXAMPLE 2

Measuring the Voltage and Current of a Fuel Cell Having a Two-layer Cathode

A fuel cell was constructed using the methods described in Example 1 except that the cathode electrode was prepared using a two-layer construction method described herein. A carbon paper electrode was loaded with 2 mg/$cm^2$ of a catalyst paint containing 90 mg of catalyst, 212 mg of a 6.67 percent TEFLON™ 30 suspension, 200 mg of water, and 1 drop of TRITON™X-100. The electrode was sintered at 350° C. under nitrogen gas. After sintering, the electrode was painted with 2 mg/$cm^2$ of a catalyst ink containing 90 mg of catalyst, 212 mg of water, and 360 mg of a 5% NAFION™ solution. The electrode was allowed to dry.

A membrane electrode assembly incorporating the two-layered cathode was hot-pressed using the methods of example 1. After hot-pressing the membrane was about 2.66 mils thick (pre-pressing thickness 4.5 mils). The membrane electrode assembly was then assembled into a methanol fuel cell. The fuel cell was attached to an external load and a power supply. The fuel cell was operated at 91° C. under load with 1 molar methanol, 3.45 liters/minute air flow at 20 psig. The power supply was used to generate a constant current of 300 ma/cm$^2$, which produced 387 mv. The impedance of the membrane electrode assembly was 6.6 milliohms.

EXAMPLE 3
Measuring the Voltage and Current of a Fuel Cell

Two samples of ULTRASON™ E6020 were sulfonated using sulfur trioxide by the methods of Example 1. The two sulfonated PES polymers had equivalent weights (EW) of 620 and 670. A 70%:30% blend of the 620 EW sulfonated PES and 670 sulfonated PES, respectively, was cast into a membrane. After hydration, the membrane was 5 mils thick.

The membrane was then assembled into a membrane electrode assembly using the methods of Example 2 including the two-layered cathode electrode. After hot-pressing the membrane was about 2.2 mils thick. The membrane electrode assembly was then assembled into a methanol fuel cell. The fuel cell was attached to an external load and a power supply. The fuel cell was operated at 91° C. under load with 1 molar methanol, 3.0 liters/minute air flow at 20 psig. The power supply was used to generate a constant current of 300 ma/cm$^2$, which produced 352 mv.

The fuel cell was then operated at 91° C. under load with 1 molar methanol, 2.05 liters/minute air flow at 20 psig. The power supply was used to generate a constant current of 300 ma/cm$^2$, at which time the fuel cell produced 343 mv. The impedance of the membrane electrode assembly was 4.8 milliohms.

EXAMPLE 4
Measuring Fuel Cell Crossover

The fuel cell of Example 2 was equipped with a Horiba model ES 510 gas sampler and a Horiba VIA 510 gas analyzer. The $CO_2$ production was measured under load and in a open circuit condition. The $CO_2$ production was converted into an electrical equivalent of methanol depletion due to crossover. The crossover rate for the fuel cell under a 300 ma/cm$^2$ load at 91° C. was 165 ma/cm$^2$. The crossover for the fuel cell in an open circuit condition was 322 ma/cm$^2$ at 91° C. These results compared favorably to a methanol fuel cell using a membrane electrode assembly constructed using a NAFION™ 117 membrane. Seven mil thick NAFION™ 117 based membranes typically have crossover rates of about 250–300 ma/cm$^2$ in an open circuit condition and 150 ma/cm$^2$ under a 300 ma/cm$^2$ load at 91° C.

EXAMPLE 5
Measuring Fuel Cell Crossover

The fuel cell of Example 3 was equipped with a Horiba model ES 510 gas sampler and a Horiba VIA 510 gas analyzer. The $CO_2$ production was measured under load and in a open circuit condition. The $CO_2$ production was converted into an electrical equivalent of methanol depletion due to crossover. The crossover rate for the fuel cell under a 300 ma/cm$^2$ load at 91° C. was 145 ma/cm$^2$. The crossover for the fuel cell in an open circuit condition was 272 ma/cm$^2$ at 91° C.

Other aspects, advantages, and modifications are within the scope of the following claims.

What is claimed is:

1. A method for manufacturing a membrane for use in a fuel cell comprising the steps of:

mixing at least one sulfonated polyphenylether sulfone polymer with an unsulfonated polyphenylether sulfone polymer to form a blend;

casting said blend for a first time;

dissolving said blend after said first casting in a solvent; and casting said blend for a second time, said blend forming a visually stable membrane.

2. The method of claim 1 wherein said solvent comprises dimethylformamide.

3. A method for manufacturing a membrane electrode assembly for use in a fuel cell comprising the steps of:

contacting a membrane comprising a blend of a sulfonated polyphenylether sulfone polymer and an unsulfonated polyphenylether sulfone polymer with a catalyst thereby forming a membrane bonding side;

coating an electrode support with an electrolyte polymer and a catalyst thereby forming an electrode bonding side;

contacting said membrane bonding side and said electrode bonding side; and bonding said membrane bonding side and said electrode bonding side.

* * * * *